(12) United States Patent
Mao et al.

(10) Patent No.: US 8,877,537 B2
(45) Date of Patent: Nov. 4, 2014

(54) METHOD FOR MANUFACTURING MEMS DEVICE

(75) Inventors: Jianhong Mao, Shanghai (CN); Deming Tang, Shanghai (CN)

(73) Assignee: Lexvu Opto Microelectronics Technology (Shanghai) Ltd, Shanghai (CN)

( * ) Notice: Subject to any disclaimer, the term of this patent is extended or adjusted under 35 U.S.C. 154(b) by 0 days.

(21) Appl. No.: 13/882,337

(22) PCT Filed: May 19, 2011

(86) PCT No.: PCT/CN2011/074289
§ 371 (c)(1), (2), (4) Date: Apr. 29, 2013

(87) PCT Pub. No.: WO2012/088820
PCT Pub. Date: Jul. 5, 2012

(65) Prior Publication Data
US 2013/0309797 A1    Nov. 21, 2013

(30) Foreign Application Priority Data
Dec. 27, 2010    (CN) .......................... 2010 1 0607826

(51) Int. Cl.
*H01L 21/00* (2006.01)
*B81C 1/00* (2006.01)
*G01P 15/08* (2006.01)
*H03H 3/007* (2006.01)

(52) U.S. Cl.
CPC ....... *B81C 1/0015* (2013.01); *G01P 2015/0828* (2013.01); *B81B 2207/07* (2013.01); *H03H 3/0072* (2013.01); *B81C 2201/0109* (2013.01); *B81C 1/00293* (2013.01); *B81B 2203/0118* (2013.01); *B81C 2201/0125* (2013.01); *B81C 2203/0145* (2013.01); *G01P 15/0802* (2013.01)
USPC .......................................................... 438/52

(58) Field of Classification Search
CPC ..................................................... H01L 21/822
USPC ........ 438/48–52, 113, 10, 126, 455; 428/209; 257/416, 418, 432, E21.001, E29.324
See application file for complete search history.

(56) References Cited

U.S. PATENT DOCUMENTS 5,690,839 A    11/1997    Min
7,005,314 B2    2/2006    Ma et al.
(Continued)

FOREIGN PATENT DOCUMENTS

CN    1123917 A    6/1996
CN    1366332 A    8/2002
(Continued)

OTHER PUBLICATIONS

International Search Report (in Chinese with English translation) and Written Opinion (in Chinese) for PCT/CN2011/074289, mailed Oct. 20, 2011; ISA/CN.

(Continued)

*Primary Examiner* — Chuong A Luu
*Assistant Examiner* — Sheikh Maruf
(74) *Attorney, Agent, or Firm* — Harness, Dickey & Pierce, P.L.C.

(57) ABSTRACT

A method for manufacturing a micro-electro-mechanical system (MEMS) device is provided. The method comprises: providing a semiconductor substrate, the semiconductor substrate having a metal interconnection structure (100) formed therein; forming a first sacrificial layer (201) on the surface of the semiconductor substrate, the material of the first sacrificial layer is amorphous carbon; etching the first sacrificial layer to form a first recess (301); covering and forming a first dielectric layer (401) on the surface of the first sacrificial layer; thinning the first dielectric layer by a chemical mechanical polishing (CMP) process, until exposing the first sacrificial layer; forming a micromechanical structure layer (500) on the surface of the first sacrificial layer and exposing the first sacrificial layer, wherein a part of the micromechanical structure layer is connected to the first dielectric layer. The method avoids polishing the amorphous carbon, shortens the period of production, and improves the production efficiency.

11 Claims, 7 Drawing Sheets

(56) References Cited

U.S. PATENT DOCUMENTS

| | | |
|---|---|---|
| 7,239,712 B1 | 7/2007 | Drury et al. |
| 2003/0006468 A1 | 1/2003 | Ma et al. |
| 2004/0219340 A1* | 11/2004 | McNeil et al. ............. 428/209 |
| 2006/0270152 A1 | 11/2006 | Jeong et al. |
| 2007/0065967 A1 | 3/2007 | Beaudry |
| 2007/0134837 A1* | 6/2007 | Sato et al. ................. 438/48 |
| 2008/0145976 A1* | 6/2008 | O'Mahony et al. ......... 438/126 |
| 2008/0194076 A1* | 8/2008 | Chang et al. ............... 438/455 |
| 2008/0290430 A1 | 11/2008 | Mahadevan et al. |
| 2009/0108381 A1* | 4/2009 | Buchwalter et al. ........ 257/415 |
| 2010/0178717 A1* | 7/2010 | Kihara et al. ............... 438/10 |
| 2010/0181631 A1 | 7/2010 | Lacey |
| 2010/0317137 A1 | 12/2010 | Dupre et al. |

FOREIGN PATENT DOCUMENTS

| | | |
|---|---|---|
| CN | 1522223 A | 8/2004 |
| CN | 101089677 A | 12/2007 |
| CN | 101183658 A | 5/2008 |
| CN | 101559915 A | 10/2009 |

OTHER PUBLICATIONS

First Chinese Office Action regarding Application No. 201010607826.6, dated Jan. 23, 2014. Partial translation provided by Unitalen Attorneys at Law.

Extended European Search Report regarding Application No. 11852932.0-1508/2631939 PCT/CN2011074289, dated Sep. 2, 2014.

* cited by examiner

METHOD FOR MANUFACTURING MEMS DEVICE

CROSS-REFERENCE TO RELATED APPLICATIONS

The present application is a Section 371 National Stage Application of International Application No. PCT/CN2011/074289, filed on May 19, 2011, which claims priority to Chinese patent application No. 201010607826.6, filed on Dec. 27, 2010, and entitled "Method for Manufacturing MEMS Device", the entire disclosure of which is incorporated herein by reference.

FIELD OF THE DISCLOSURE

The present disclosure relates to semiconductor manufacturing, and more particularly, to a method for manufacturing a MEMS device.

BACKGROUND OF THE DISCLOSURE

Micro-Electro-Mechanical Systems (MEMS), which are suitable for integrated production, are micro devices or systems in which micro mechanisms, micro sensors, micro operators, and signal processing and control circuits are gathered as integral structures. MEMS are developed with the evolution of semiconductor integrated circuit precise manufacturing and super-precise mechanical manufacturing. Micro-electro devices applying MEMS technology are widely used in aviation, aerospace, environment supervision, biological medicine, and almost all fields human may access.

Compared with conventional mechanical structures, MEMS devices are smaller, at most not greater than one centimeter. Some MEMS devices only have several microns, and component layers thereof may have even less thickness. Since semiconductor materials, mainly silicon, are used in MEMS manufacturing, those proven techniques and processes applied in semiconductor integrated circuit manufacturing may be widely used to produce MEMS devices, thereby achieving volume production with relatively low costs. Micro mechanical components, applied as sensor, driving and moving structures, are essential to a MEMS device. Normally, a micro mechanical component, including a fixed support component and a movable free end which is suspended, needs to be disposed in a sealed cavity to avoid external influences.

Formations of sacrificial layers are required to enable a micro mechanical component to be suspended in a semiconductor structure, basic processing steps thereof including: forming a groove with a required size in a semiconductor dielectric layer; filling sacrificial material into the groove; forming a micro mechanical component on the sacrificial material; and removing the sacrificial material to suspend the micro mechanical component. To obtain more information of forming a MEMS device with a suspended micro mechanical component, please refer to US patent publication No. 2008290430A1 and 2007065967, and U.S. Pat. No. 7,239,712B1.

Current techniques have following drawbacks. Chemical vapor deposition (CVD) is usually used when filling a sacrificial material into the groove. To ensure the groove is completely filled, it is normally necessary that the sacrificial material may be deposited to cover the semiconductor dielectric layer out of the groove. Thereafter, the sacrificial material layer is thinned until the semiconductor dielectric layer is exposed using a chemical mechanical polishing (CMP) process. Therefore, the sacrificial material layer in the groove may be flush with the semiconductor dielectric layer around. Sacrificial materials commonly used in the art include amorphous carbon, some organic polymeric materials, and the like, which may be easily removed as gas using an ashing process. However, these materials are unlikely to react with polishing solutions due to special chemical characteristics thereof. As a result, the CMP process may have an unacceptable low polishing speed of the sacrificial material. Besides, the polishing speed of the sacrificial material is much faster than that of the semiconductor dielectric layer, which may, on the one hand, prolong the polishing period, on the other hand, bring a difficulty for stopping the polishing precisely on the surface of the semiconductor dielectric layer. A loss on the semiconductor dielectric layer's thickness is likely to occur.

BRIEF SUMMARY OF THE DISCLOSURE

Embodiments of the present disclosure provide MEMS device manufacturing methods, which may increase the polishing speed of sacrificial material in the device and avoid over polishing.

According to one embodiment of the present disclosure, a method for forming a MEMS device is provided. The method including:

providing a semiconductor substrate with a metal interconnection structure formed therein;

forming a first sacrificial layer, including amorphous carbon, on the semiconductor substrate;

etching the first sacrificial layer to form a first groove;

forming a first dielectric layer overlaying the first sacrificial layer;

polishing the first dielectric layer until the first sacrificial layer is exposed by using a chemical mechanical polishing process; and forming a micro mechanical component layer on the first sacrificial layer, where a portion of the first sacrificial layer remains exposed, and a portion of the micro mechanical component layer is connected with the first dielectric layer.

Optionally, etching the first sacrificial layer to form the first groove includes: forming a first patterned mask layer on the first sacrificial layer, wherein the first patterned mask layer defines a pattern of the first dielectric layer of the MEMS device;

etching the first sacrificial layer until the semiconductor substrate is exposed, to form the first groove; and removing the first patterned mask layer.

Optionally, the first dielectric layer includes silicon oxide or silicon nitride, and is formed by using a chemical vapor deposition process.

Optionally, a first drive layer is formed in the semiconductor substrate, below the micro mechanical component layer and with a position corresponding to that of the micro mechanical component layer.

Optionally, a first contact hole is formed in the first dielectric layer, through which the micro mechanical component layer is electrically connected to the metal interconnection structure in the semiconductor substrate.

Optionally, the method for forming a MEMS device further includes:

forming a second sacrificial layer, including a material same as that of the first sacrificial layer, on the micro mechanical component layer and the first sacrificial layer;

etching the second sacrificial layer to form a second groove;

forming a second dielectric layer overlaying the second sacrificial layer;

polishing the second dielectric layer until the second sacrificial layer is exposed by using a chemical mechanical polishing process;

forming an isolating layer on the second sacrificial layer;

etching the isolating layer to form at least one through hole exposing the second sacrificial layer;

removing the first and second sacrificial layers through the at least one through hole; and forming a covering layer on the isolating layer, wherein the covering layer covers the at least one through hole.

Optionally, etching the second sacrificial layer to form the second groove includes:

forming a second patterned mask layer on the second sacrificial layer, wherein the second patterned mask layer defines a pattern of the second dielectric layer of the MEMS device;

etching the second sacrificial layer until the micro mechanical component layer or the first dielectric layer is exposed, to form the first groove; and removing the second patterned mask layer.

Optionally, material and formation process of the second dielectric layer are the same as those of the first dielectric layer.

Optionally, before forming the isolating layer, a second drive layer is formed on the second sacrificial layer and a second contact hole is formed in the first and second dielectric layers, the second drive layer has a position corresponding to that of the micro mechanical component layer below, and the second drive layer is electrically connected to the metal interconnection structure in the semiconductor substrate through the second contact hole.

Optionally, removing the first and second sacrificial layers includes: supplying oxygen into the at least one through hole, and removing the first and second sacrificial layers using an ashing process at a temperature within a range from about 350° C. to about 450° C.

Compared with the current techniques, in embodiments of the present disclosure, the sacrificial layer is formed and patterned prior to the formation of the dielectric layer, thereby avoiding polishing the amorphous carbon. Therefore, production cycle may be reduced and efficiency may be tremendously improved.

BRIEF DESCRIPTION OF THE DRAWINGS

The above described and other features and advantages will become more apparent to those of ordinary skill in the art by describing in detail exemplary embodiments with reference to the attached drawings. The same reference numbers may be used in different drawings to identify the same or similar elements. The figures are not drawn to scale, and it is noted that the drawings are provided for illustrative purposes only.

DETAILED DESCRIPTION OF THE DISCLOSURE

In current MEMS manufacturing techniques, when forming a cavity for accommodating a suspended micro mechanical component, a groove is normally formed in advance, then a sacrificial material layer is filled into the groove to support upper structures. If inert substance like amorphous carbon is applied as the sacrificial material, it might be quite difficult to make the sacrificial material layer thinner using a conventional chemical mechanical polishing (CMP) process. In embodiments of the present disclosure, a sacrificial material layer with a desired thickness is directly formed and patterned, so that there is no need to perform a CMP on it.

Figure 1:
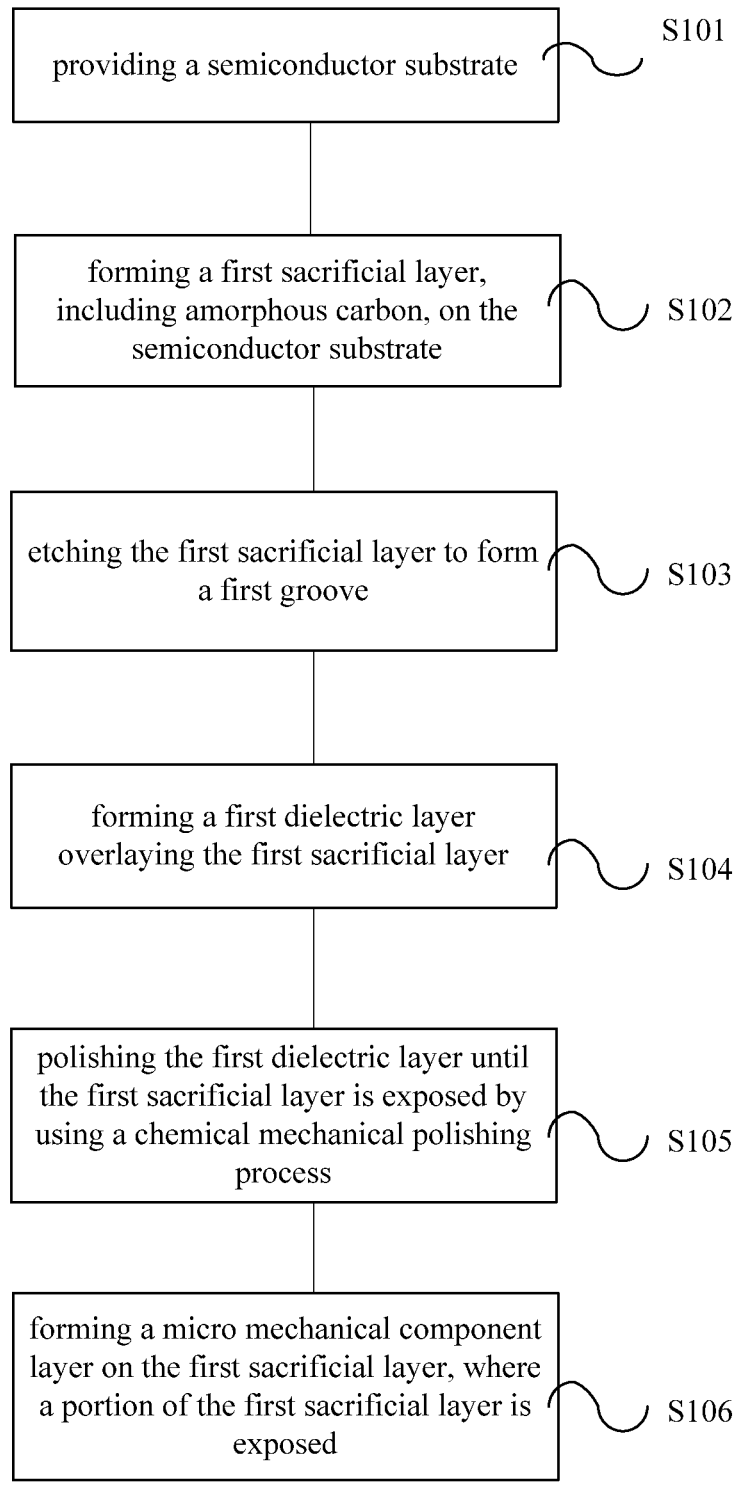
FIG. 1 schematically illustrates a flow chart of a method for forming a MEMS device according to one embodiment of the present disclosure.

FIG. 1 schematically illustrates a flow chart of a method for forming a MEMS device according to one embodiment of the present disclosure, including steps of S101 to S106.

Step S101, providing a semiconductor substrate.

The semiconductor substrate constitutes a semiconductor substructure of the MEMS device, which may not be limited to monocrystalline silicon substrate or silicon-on-insulator substrate. The semiconductor substrate may further include bottom metal interconnection structures, chips or other semiconductor elements which are electrically connected with the MEMS device. Furthermore, drive components, such as an electrode plate, adapted for driving the MEMS device's micro mechanical component, may be formed in the semiconductor substrate.

Step S102, forming a first sacrificial layer, including amorphous carbon, on the semiconductor substrate.

The first sacrificial layer has a thickness determined based on the size of a cavity to be formed subsequently for accommodating the MEMS device's micro mechanical component. For example, suppose the MEMS device's micro mechanical component is a cantilever which can move freely for a distance of h, accordingly, the thickness of the first sacrificial layer should be set at least larger than h, so as to ensure that the cavity formed by removing the first sacrificial layer in a subsequent process may have adequate space for accommodating the cantilever to bend or vibrate.

Step S103, etching the first sacrificial layer to form a first groove.

A dielectric layer, adapted for supporting the micro mechanical component, is to be formed in the first groove. And a contact hole is to be formed in the dielectric layer to electrically connect the micro mechanical component. Therefore, the first groove's size needs to be specifically determined based on the above requirements.

Step S104, forming a first dielectric layer overlaying the first sacrificial layer.

The first dielectric layer not only fills the first groove, but also overlays the first sacrificial layer, so as to ensure that the first groove is completely filled without any gap remained. Besides, the first dielectric layer may have a material which might be easily to be polished using CMP, for example, silicon oxide, silicon nitride, or the like.

Step S105, polishing the first dielectric layer until the first sacrificial layer is exposed by using a CMP process.

Since amorphous carbon is a kind of inert substance which is difficult to react with polishing solutions, namely, unlikely to be polished in the CMP process, the first sacrificial layer is suitable to be used as a polishing stop layer when polishing the first dielectric layer. When the CMP process ends, only a portion of the first dielectric layer remains in the first groove, and the portion has a top surface flushing with that of the first sacrificial layer.

Step S106, forming a micro mechanical component layer on the first dielectric layer and the first sacrificial layer, where the first sacrificial layer is exposed.

As the first dielectric layer and the first sacrificial layer are flush with each other, a micro mechanical component, such as a cantilever or a suspension beam, might be easily formed thereon with support thereof. Normally, etching processes need to be performed to form structures like through holes and grooves to expose the first sacrificial layer, so that the first sacrificial layer can be removed subsequently. When the first sacrificial layer is removed, the micro mechanical component is only partially supported by the first dielectric layer, with a lower space formed under an un-supported part thereof, so that a suspension status is achieved.

Furthermore, if the micro mechanical component of the MEMS device needs to be sealed in a accommodation cavity, and drive structures is required to be formed above the micro mechanical component, formation of an upper sacrificial layer, drive structures and isolating structures are to be performed after step S106, so as to form upper structures of the micro mechanical component.

Characteristics of the present disclosure will be further described with reference to an embodiment illustrating a method for forming a MEMS device with a cantilever formed within a sealed cavity.

The MEMS device to be formed is a micro switch including a cantilever which can bend under the action of an electric field. And the cantilever is suspended in a sealed vacuum cavity without interferences from outside. An upper electrode and a lower electrode are disposed respectively on and under the sealed cavity, used to generate the electric field to drive the cantilever. FIGS. 2 to 18 schematically illustrate cross-sectional views of intermediate structures in a process for forming the MEMS device.

Figure 2:
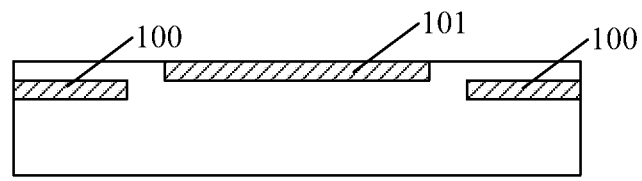
FIGS. 2 to 18 schematically illustrate cross-sectional views of intermediate structures in a method for forming a MEMS device according to one embodiment of the present disclosure.

As shown in FIG. 2, a semiconductor substrate is provided, including a metal interconnection layer 100 and a lower electrode plate 101. The metal interconnection layer 100 is adapted for electrically connecting with the MEMS device's micro mechanical component (a cantilever). The lower electrode plate 101, used as a first drive layer, is disposed on a surface area of the semiconductor substrate.

Figure 3:
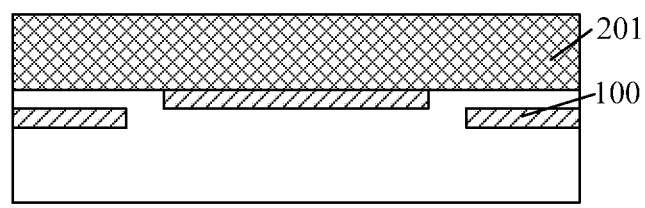

As shown in FIG. 3, a first sacrificial layer 201 is formed on the semiconductor substrate. The first sacrificial layer 201 is adapted for forming a lower space of the cantilever, having a thickness not less than a distance to which the cantilever may be bent downward. In some embodiments, the first sacrificial layer 201 may be made of amorphous carbon using chemical vapor deposition (CVD).

Figure 4:
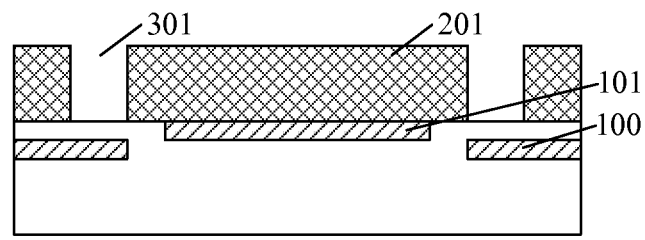

As shown in FIG. 4, the first sacrificial layer 201 is etched to form at least one first groove 301. The etching may be plasma etching. A chemical reaction is difficult to occur between amorphous carbon and other substances, but amorphous carbon has a loose structure, so that it is relatively easy to be removed with a dry etching process with a blasting effect, such as plasma etching, or the like. Specifically, a photoresist mask is formed on the first sacrificial layer 201 using a photolithographic process, and the first sacrificial layer 301 is etched with the semiconductor substrate as an etching stop layer, so as to form the first groove 301. The semiconductor substrate is exposed from the first groove 301 which is also aligned with the metal interconnection layer 100, so that a contact hole connected with the metal interconnection layer 100 may be formed in the first groove 301.

Figure 5:
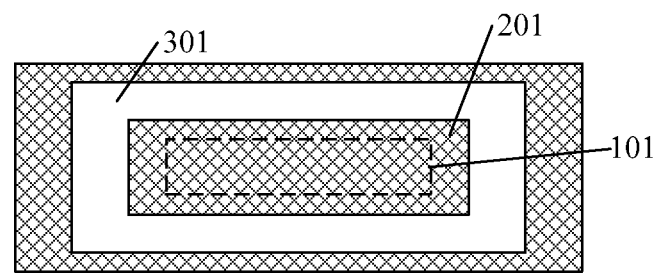

FIG. 5 schematically illustrates a top view of FIG. 4. As shown in conjunction with FIG. 5, a square region is separated from the first sacrificial layer by the first groove 301. The first sacrificial layer, within the square region, has a bottom aligned with the lower electrode plate 101. As limited by projection relationship, the lower electrode plate 101, which is shielded, is shown with broken lines in FIG. 5.

Figure 6:
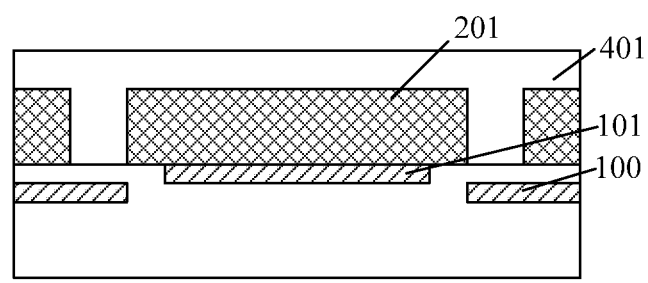

As shown in FIG. 6, a first dielectric layer 401 is formed on the above-formed semiconductor structure. The first dielectric layer 401 not only fills the first groove 301, but also covers on the first sacrificial layer 201. The first dielectric layer 401 may be made of a common semiconductor dielectric material, such as silicon oxide, silicon nitride, or the like. The first dielectric layer 401 may be formed with CVD.

Figure 7:
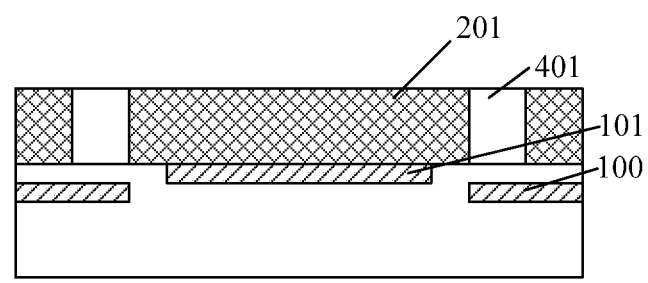

As shown in FIG. 7, a CMP process is performed to make the first dielectric layer 401 thinner until the first sacrificial layer 201 is exposed. Since amorphous carbon is difficult to react with the polishing solution and whereby hardly to be polished, the CMP process is likely to stop on the first sacrificial layer 201. When the first dielectric layer 401 on the first sacrificial layer 201 is polished out, only the first dielectric layer 401 in the first groove 301 remains and the remaining first dielectric layer 401 has a top surface flushing with that of the first sacrificial layer 201.

Figure 8:
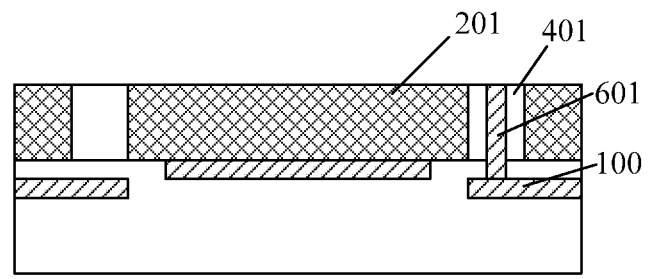

As shown in FIG. 8, a contact hole 601, electrically connecting with the metal interconnection layer 100 in the semiconductor substrate, is formed in the remaining first dielectric layer 601.

Figure 9:
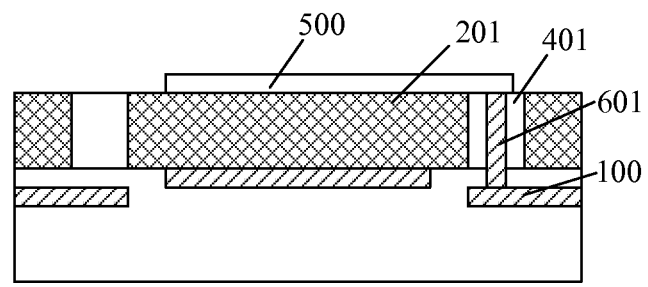
Figure 10:
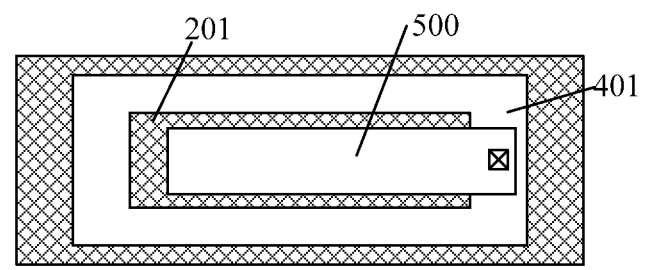

As shown in FIG. 9, a micro mechanical component layer 500 is formed on the first dielectric layer 401 and the first sacrificial layer 201, where the first sacrificial layer 201 is exposed. FIG. 10 schematically illustrates a top view of FIG. 9. As shown in conjunction with FIG. 10, the micro mechanical component layer 500 is a metal cantilever with one end connected with the first dielectric layer 401 as a fixed end and another end disposed on the first sacrificial layer 201 as a free end. The micro mechanical component layer 500 is electrically connected to the metal interconnection layer 100 through the contact hole 601 at the fixed end thereof.

Specifically, a physical vapor deposition process may be performed to form a metal layer overlaying the first dielectric layer 401 and the first sacrificial layer 201. Thereafter, the metal layer may be patterned to form the metal cantilever and partially expose the first sacrificial layer 201.

Figure 11:
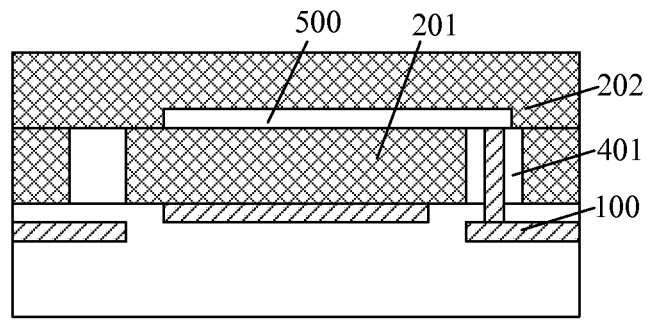

As shown in FIG. 11, a second sacrificial layer 202 is formed on the above-formed semiconductor structure. The second sacrificial layer 202 is adapted for forming an upper space of the cantilever, so that the second sacrificial layer 202 at least covers the first sacrificial layer 201 and the micro mechanical component layer 500, and has a thickness not less than a distance to which the cantilever may move upwards. In some embodiments, the first and second sacrificial layers 201 and 202 may have the same material and formation process, and are connected with each other.

Figure 12:
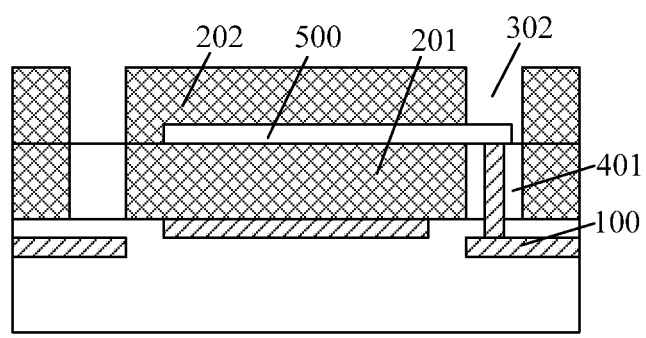
Figure 13:
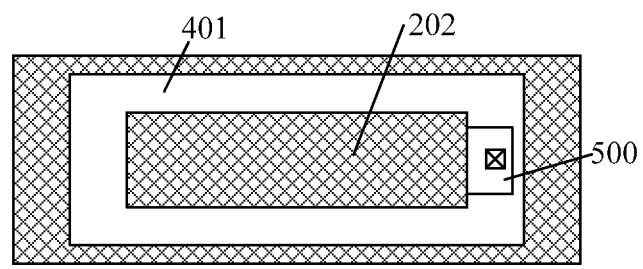

As shown in FIG. 12, the second sacrificial layer 202 is etched to form a second groove 302. The second groove 302 has a bottom portion aligned with the first dielectric layer 401 and partially exposes the micro mechanical component layer 500. FIG. 13 schematically illustrates a top view of FIG. 12. As shown in conjunction with FIG. 13, a square region, corresponding to the separated square region of the first sacrificial layer 201, is also separated from the second sacrificial layer 202 by the second groove 302. Etching the second sacrificial layer 202 may be performed using a plasma etching process.

Figure 14:
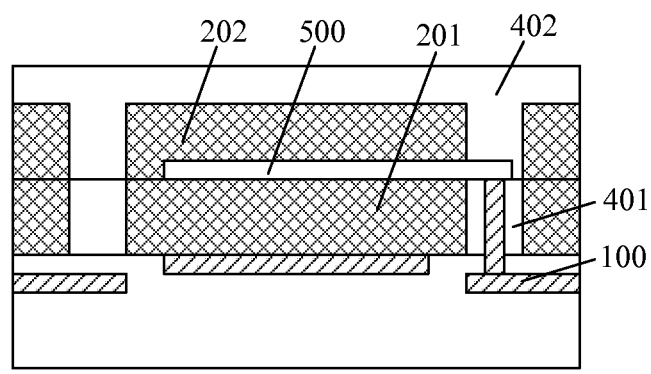

As shown in FIG. 14, a second dielectric layer 402 is formed overlaying the second sacrificial layer 202. The second dielectric layer 402 further fills the second groove 302. Material and formation process of the second dielectric layer 402 may be the same as that of the first dielectric layer 401.

Figure 15:
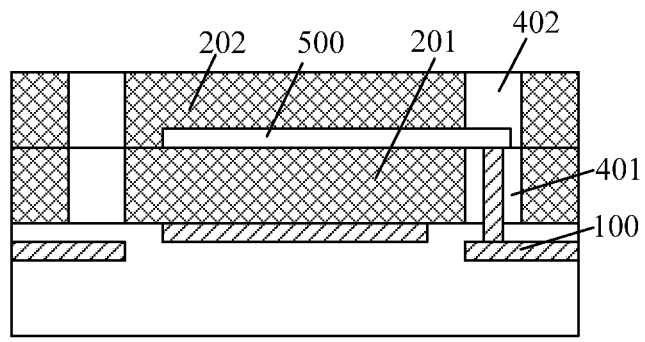

As shown in FIG. 15, another CMP process is performed to make the first dielectric layer 401 thinner until the first sacrificial layer 201 is exposed. Similarly, this CMP process is easy to stop on the second sacrificial layer 202. When the second dielectric layer 402 on the second sacrificial layer 202 is polished out, only the second dielectric layer 402 in the second groove 302 remains, and the remaining second dielectric layer 402 has a top surface flushing with that of the second sacrificial layer 202.

Figure 16:
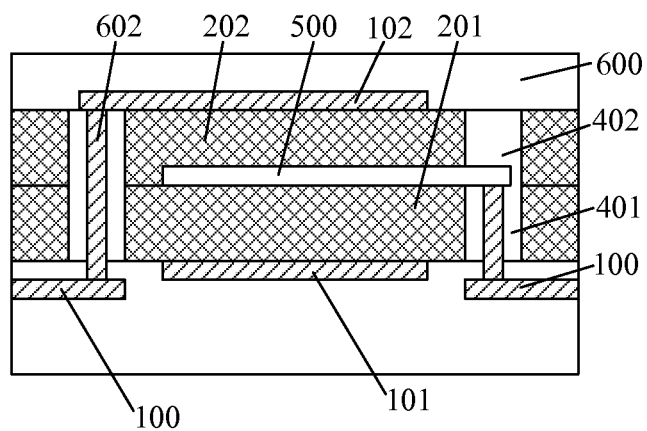

As shown in FIG. 16, an upper electrode plate 102 and an isolating layer 600 are successively formed on the second sacrificial layer 202. The upper electrode plate 102, as a second drive layer, is corresponding to the micro mechanical component layer 500 and the lower electrode plate 101. The upper electrode plate 102 and the lower electrode plate 101 generate an electric field in the MEMS device to be formed. Therefore, an electric field force is formed to drive the micro mechanical component layer 500. Besides, prior to the formation of the isolating layer 600, a contact hole 602 may be formed in the second dielectric layer 402 and the first dielectric layer 401. The upper electrode plate 602 is electrically connected to the metal interconnection layer 100 in the semiconductor substrate through the contact hole 602.

Figure 17:
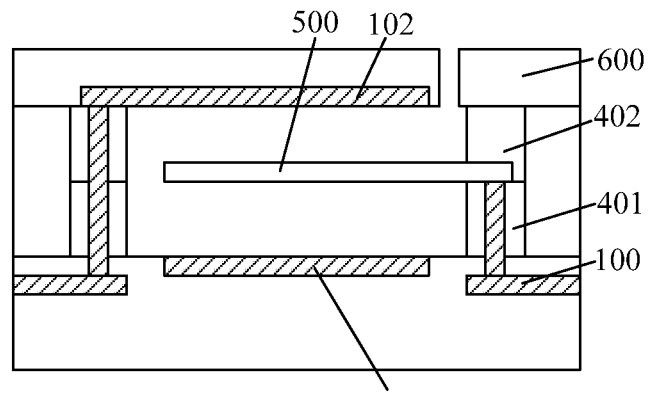

As shown in FIG. 17, the isolating layer 600 is etched to form at least one through hole from which the second sacrificial layer 202 is exposed. Thereafter, the first and second sacrificial layers 201 and 202 are removed through the at least one through hole.

Specifically, in some embodiments, oxygen is supplied into the through hole, and the first and second sacrificial layers 201 and 202 are removed by using an ashing process with a temperature within a range from about 350° C. to about 450° C. Under a temperature within the above range, amorphous carbon can be oxidated into CO or $CO_2$ gas and eliminated through the through hole. Therefore, the first and second sacrificial layers 201 and 202 may be completely removed without affecting other components of the device, whereby the upper space and the lower space of the micro mechanical component layer 500 (i.e., the cantilever) are formed. The cantilever only has one fixed end which is connected with the first dielectric layer 401 and the second dielectric layer 402, while another end thereof is suspended in the above-described space and may be bent upwards or downwards.

Figure 18:
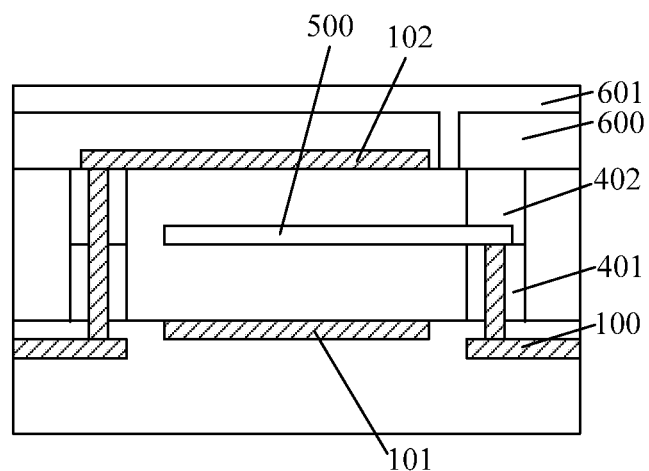

As shown in FIG. 18, a covering layer 601 is formed on the isolating layer 600 to cover the through hole using a CVD process. During the formation of the covering layer 601, deposition material is likely to block the through hole, rather than enter into the isolating layer 600. When the through hole is blocked, the upper space and the lower space constitute a sealed cavity for accommodating the cantilever.

Formation of the MEMS device is completed after conducting steps described above. It can be concluded that when forming the MEMS device according to embodiments of the present disclosure, the sacrificial layer is formed on the semiconductor substrate and patterned in advance, so at to define the position of the micro mechanical component to be formed subsequently. Thereafter, the dielectric layer of the MEMS device is formed. Therefore, there is no need to perform a CMP process to make the amorphous carbon sacrificial layer thinner. Compared with the current techniques, production cycle may be reduced and efficiency may be tremendously improved.

The invention is disclosed, but not limited, by preferred embodiments as above. Based on the disclosure of the invention, those skilled in the art can make any variation and modification without departing from the scope of the invention. Therefore, any simple modification, variation and polishing based on the embodiments described herein is within the scope of the present invention.

What is claimed is:

1. A method for forming a MEMS device, comprising:
    providing a semiconductor substrate with a metal interconnection structure formed therein;
    forming a first sacrificial layer, including amorphous carbon, on the semiconductor substrate;
    etching the first sacrificial layer to form a first groove;
    forming a first dielectric layer overlaying the first sacrificial layer and the first groove;
    polishing the first dielectric layer until the first sacrificial layer is exposed by using a chemical mechanical polishing process;
    forming a micro mechanical component layer on the first sacrificial layer, where a portion of the first sacrificial layer is exposed, and a portion of the micro mechanical component layer is connected with the first dielectric layer;
    forming a second sacrificial layer, comprising a material same as that of the first sacrificial layer, on the micro mechanical component layer and the first sacrificial layer;
    etching the second sacrificial layer to form a second groove;
    forming a second dielectric layer overlaying the second sacrificial layer;
    polishing the second dielectric layer until the second sacrificial layer is exposed by using a chemical mechanical polishing process;
    forming an isolating layer on the second sacrificial layer;
    etching the isolating layer to form at least one through hole exposing the second sacrificial layer;
    removing the first and second sacrificial layers through the at least one through hole; and
    forming a covering layer on the isolating layer, wherein the covering layer covers the at least one through hole.

2. The method according to claim 1, wherein etching the second sacrificial layer to form the second groove comprises:
    forming a second patterned mask layer on the second sacrificial layer, wherein the second patterned mask layer defines a pattern of the second dielectric layer of the MEMS device;
    etching the second sacrificial layer by using a plasma etching process until the micro mechanical component layer or the first dielectric layer is exposed to form the second groove; and
    removing the second patterned mask layer.

3. The method according to claim 1, wherein material and formation process of the second dielectric layer are the same as those of the first dielectric layer.

4. The method according to claim 1, wherein before forming the isolating layer, a second drive layer is formed on the second sacrificial layer, and the second drive layer has a position corresponding to that of the micro mechanical component layer below.

5. The method according to claim 4, wherein before forming the isolating layer, a second contact hole is formed in the first and second dielectric layers, and the second drive layer is electrically connected to the metal interconnection structure in the semiconductor substrate through the second contact hole.

6. The method according to claim 1, wherein removing the first and second sacrificial layers comprises: supplying oxygen into the at least one through hole, and removing the first and second sacrificial layers using an ashing process.

7. The method according to claim 6, wherein the ashing process is performed at a temperature within a range from about 350° C. to about 450° C.

8. The method according to claim 1, wherein etching the first sacrificial layer to form the first groove comprises:
    forming a first patterned mask layer on the first sacrificial layer, wherein the first patterned mask layer defines a pattern of the first dielectric layer of the MEMS device;

etching the first sacrificial layer by using a plasma etching process until the semiconductor substrate is exposed to form the first groove; and removing the first patterned mask layer.

9. The method according to claim 1, wherein the first dielectric layer comprises silicon oxide or silicon nitride, and is formed by using a chemical vapor deposition process.

10. The method according to claim 1, wherein a first drive layer is formed in the semiconductor substrate, below the micro mechanical component layer and with a position corresponding to that of the micro mechanical component layer.

11. The method according to claim 1, wherein before forming the micro mechanical component layer on the first sacrificial layer, a first contact hole is formed in the first dielectric layer, through which the micro mechanical component layer is electrically connected to the metal interconnection structure in the semiconductor substrate.

* * * * *